United States Patent
Cheng et al.

(10) Patent No.: US 7,157,335 B1
(45) Date of Patent: Jan. 2, 2007

(54) USING THIN UNDOPED TEOS WITH BPTEOS ILD OR BPTEOS ILD ALONE TO IMPROVE CHARGE LOSS AND CONTACT RESISTANCE IN MULTI BIT MEMORY DEVICES

(75) Inventors: Ning Cheng, Cupertino, CA (US); Minh Van Ngo, Fremont, CA (US); Hirokazu Tokuno, San Jose, CA (US); Lu You, San Jose, CA (US); Angela T. Hui, Fremont, CA (US); Yi He, Fremont, CA (US); Brian Mooney, Mountain View, CA (US); Jean Yei-Mei Yang, Sunnyvale, CA (US); Mark T. Ramsbey, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 263 days.

(21) Appl. No.: 10/917,562

(22) Filed: Aug. 13, 2004

(51) Int. Cl.
*H01L 21/336* (2006.01)
(52) U.S. Cl. ............... 438/261; 438/288; 257/E21.679
(58) Field of Classification Search ............... 438/261, 438/288, 591, 954; 257/E21.679
See application file for complete search history.

(56) References Cited

U.S. PATENT DOCUMENTS

| | | | |
|---|---|---|---|
| 6,580,120 B1 * | 6/2003 | Haspeslagh | 257/315 |
| 6,653,189 B1 | 11/2003 | Haddad et al. | |
| 6,673,677 B1 * | 1/2004 | Hofmann et al. | 438/257 |

* cited by examiner

*Primary Examiner*—Chandra Chaudhari
(74) *Attorney, Agent, or Firm*—Eschweiler & Associates, LLC

(57) ABSTRACT

The present invention facilitates dual bit memory devices and operation of dual bit memory device by providing systems and methods that employ a relatively thin undoped TEOS liner during fabrication, instead of a relatively thick TEOS layer that is conventionally used. Employment of the relatively thin liner facilitates dual bit memory device operation by mitigating charge loss and contact resistance while providing protection against unwanted dopant diffusion. The present invention includes utilizing a relatively thin undoped TEOS liner that is formed on wordlines and portions of a charge trapping dielectric layer. The relatively thin undoped TEOS liner is formed with a thickness of less than about 400 Angstroms so that contact resistance and charge loss are improved and yet providing suitable protection for operation of the device. Additionally, the present invention includes foregoing with an undoped TEOS liner altogether.

14 Claims, 11 Drawing Sheets

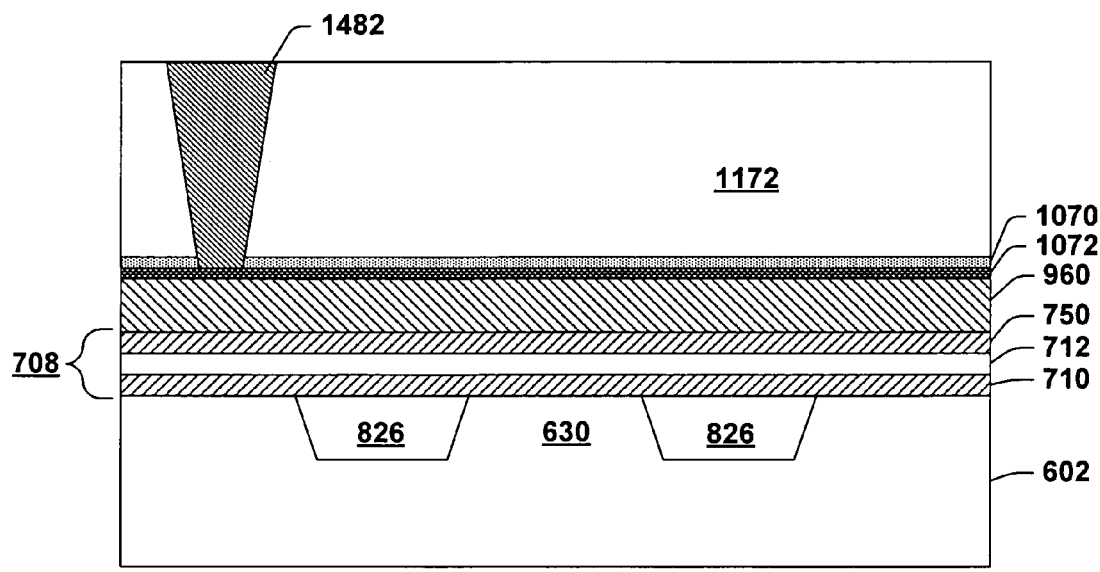
Fig. 14A ← 600
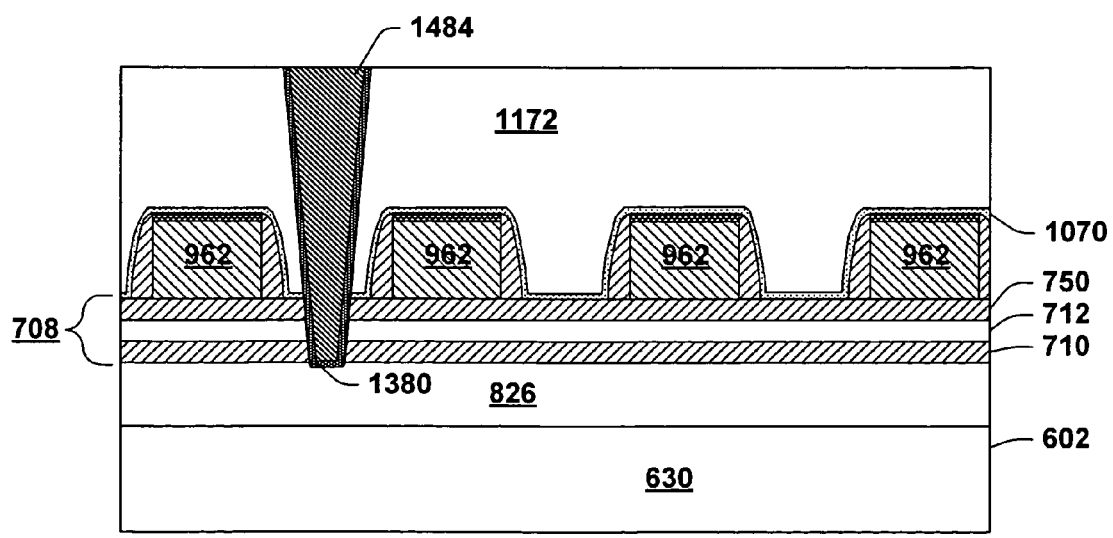
Fig. 14B ← 600

USING THIN UNDOPED TEOS WITH BPTEOS ILD OR BPTEOS ILD ALONE TO IMPROVE CHARGE LOSS AND CONTACT RESISTANCE IN MULTI BIT MEMORY DEVICES

FIELD OF INVENTION

The present invention relates generally to memory devices and the like, and in particular to fabricating multi bit memory devices with improved charge loss and contact resistance by using a thin undoped TEOS layer with a BPTEOS ILD layer or a BPTEOS ILD layer alone.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where single bits of data are stored in and read from respective memory cells. The cells are generally programmed by hot electron injection and erased by Fowler-Nordheim tunneling. As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer.

Individual memory cells are organized into individually addressable units or groups, which are accessed for read, program, or erase operations through address decoding circuitry. The individual memory cells are typically comprised of a semiconductor structure adapted for storing a bit of data. For instance, many conventional memory cells include a stacked gate metal oxide semiconductor (MOS) device, such as a transistor in which a binary piece of information may be retained. The memory device includes appropriate decoding and group selection circuitry, as well as circuitry to provide voltages to the cells being operated on.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

The memory cell generally has a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

In a NOR configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash cells in the array generally have their source terminals coupled to a common source terminal. In operation, individual flash cells are addressed via the respective bitline and wordline using the peripheral decoder and control circuitry for programming (writing), reading or erasing functions.

By way of further detail, the single bit stacked gate flash memory cell is programmed by applying a relatively high voltage to the control gate and connecting the source to ground and the drain to a predetermined potential above the source. A resulting high electric field across the tunnel oxide leads to the Fowler-Nordheim tunneling phenomena. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bitline, which may be connected to the drains of other cells in a byte or word group. The voltage at the drain in conventional stacked gate memory cells is typically provided at between 0.5 and 1.0 volts in a read operation. A voltage is then applied to the gate (e.g., the wordline) of the memory cell transistor in order to cause a current to flow from the drain to source. The read operation gate voltage is typically applied at a level between a programmed threshold voltage ($V_T$) and an unprogrammed threshold voltage. The resulting current is measured, by which a determination is made as to the data value stored in the cell.

A very modern memory technology is dual bit memory, which allows multiple bits to be stored in a single cell. In this technology, a memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing of two bits.

In a virtual ground type architecture, dual bit memory cells have a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Wordlines and bitlines are isolated from each other by forming an interlayer dielectric layer over the wordlines and bitlines. Typically, a relatively thick undoped TEOS liner and/or a nitride etch stop layer are formed and employed on the device prior to formation of the interlayer dielectric layer in order to mitigate dopant diffusion. Contacts are formed in the interlayer dielectric layer to connect to the wordlines and bitlines to allow operation of the memory device. The contacts provide an external connection to the device. However, the relatively thick TEOS liner can increase unwanted charge loss and contact resistance. Charge loss is a loss of charge for memory cells over time that can cause a cell initially in one charge state to move to a different charge state. Contact resistance is resistance at an interface between a formed contact and a wordline or bitline and can lead to undesired voltage drops across the interface that negatively impact programming, erasing, and reading of the memory device.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention facilitates dual bit memory devices and operation of dual bit memory device by providing systems and methods that employ a relatively thin undoped TEOS liner during fabrication, instead of a relatively thick TEOS layer that is conventionally used. Employment of the relatively thin liner facilitates dual bit memory device operation by mitigating charge loss and contact resistance while providing protection against unwanted dopant diffusion. The present invention includes utilizing a relatively thin undoped TEOS liner that is formed on wordlines and portions of a charge trapping dielectric layer. The relatively thin undoped TEOS liner is formed with a thickness of less than about 400 Angstroms so that contact resistance and charge loss are improved and yet providing suitable protection for operation of the device. Additionally, the present invention includes foregoing with an undoped TEOS liner altogether.

A method of fabricating a dual bit memory device with a relatively thin undoped TEOS liner is provided. The method forms a charge trapping dielectric layer (e.g., oxide-nitride-oxide) on a semiconductor substrate. Bitlines are formed in the substrate below the charge trapping dielectric layer by implanting a suitable dopant. Wordline material is deposited on the charge trapping dielectric layer and is then patterned to form wordlines. Subsequently, a relatively thin (e.g., less than about 400 Angstroms) undoped TEOS liner is formed on the wordlines and exposed portions of the charge trapping dielectric layer. Then, a doped interlayer dielectric layer (e.g., doped with boron and phosphor) is formed over the device and on the relatively thin undoped TEOS liner. Wordline contacts and bitline contacts are formed in the interlayer dielectric layer to provide electrical contact with associated wordlines and/or bitlines.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIGS. 14A and 14B are cross sectional views of the dual bit memory device after formation of wordline contacts and bitline contacts in accordance with an aspect of the present invention.

DETAILED DESCRIPTION OF THE INVENTION

Figure 1:
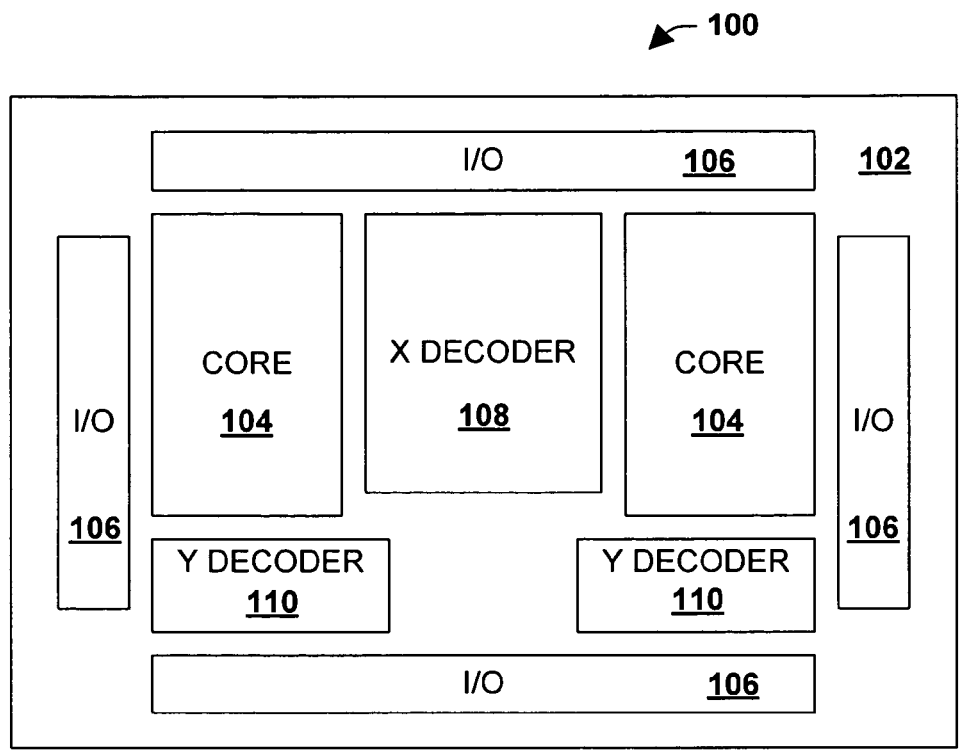
FIG. 1 is a top view of a dual bit flash memory device in accordance with an aspect of the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

Conventionally, dual bit memory devices employ a relatively thick undoped tetraethylorthosilicate (TEOS) liner or a etch stop layer (e.g., comprised of nitride) before forming an interlayer dielectric layer (ILD) in order to mitigate diffusion. The ILD is typically a borophospho-tetraethylorthosilicate (BPTEOS) layer that includes n-type and p-type materials. The relatively thick TEOS liner is typically at least 400 Angstroms thick and is employed to mitigate undesired diffusion of boron and phosphor from the ILD layer and elsewhere in the memory devices, which can hamper device operation.

The inventors of the present invention appreciate that the relatively thick liner can, at least partially, increase charge loss and increase contact resistance. Charge loss is loss of charge in a memory cell over a period of time and can lead to state changes and data errors. Contact resistance is the resistance of an interface between formed contacts and bitline and/or wordline regions. The relatively thick TEOS liner can alter this interface detrimentally thereby worsening contact resistance and charge loss. As an example, remaining polymers from the relatively thick TEOS liner may be present after contact formation and negatively interfere with salicide formation at wordline-contact and/or bitline-contact interfaces.

The inventors of the present invention appreciate that a relatively thin undoped TEOS liner can be employed instead of the relatively thick undoped TEOS liner without substantial detriment. Additionally, employment of the relatively thin liner facilitates dual bit memory device operation by mitigating charge loss and contact resistance. The present invention includes utilizing a relatively thin undoped TEOS liner with a thickness of less than about 400 Angstroms in formation of dual bit memory devices. Furthermore, the present invention includes formation of a dual bit memory device without an undoped TEOS liner (e.g., thickness of 0).

Referring initially to FIG. 1, a top view of an exemplary dual bit flash memory 100 in accordance with an aspect of the present invention is illustrated. The memory 100 generally includes a semiconductor substrate 102 in which one or more high-density core regions 104 and one or more lower-density peripheral portions are formed. The high-density core regions typically include one or more M by N arrays 104 of individually addressable, substantially identical dual bit flash memory cells. The lower-density peripheral portions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
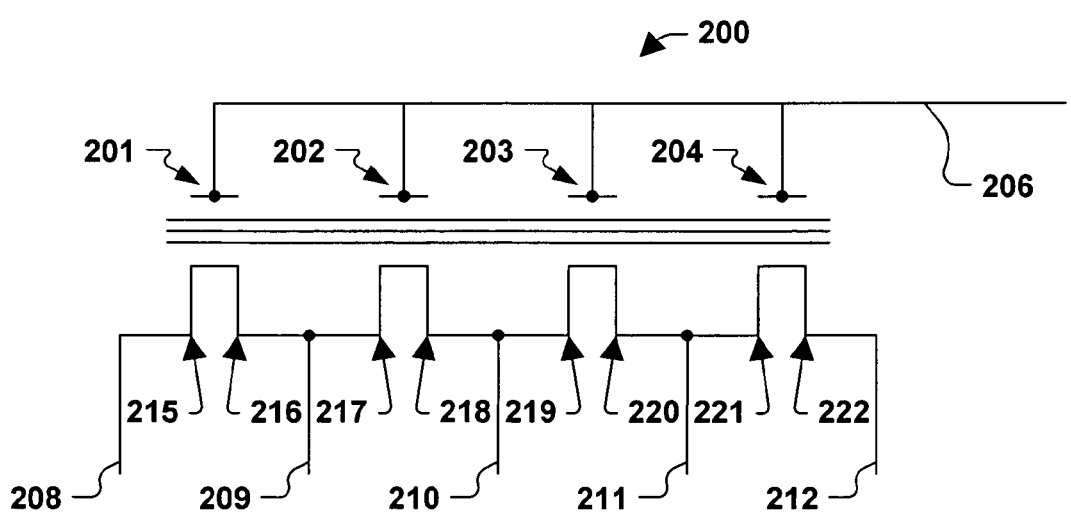
FIG. 2 is a schematic illustration of a portion of a memory core such as may include at least part of one of the cores depicted in FIG. 1 in a virtual ground type configuration in accordance with an aspect of the present invention.

Turning to FIG. 2, a schematic illustration is presented of a portion 200 of an exemplary memory core such as may include at least part of one of the M by N array cores 104 depicted in FIG. 1 in accordance with an aspect of the present invention. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. It will be appreciated that although adjacent memory cells share common bitlines, the adjacent memory cells do not interfere with each other because the memory cells are typically programmed one at a time and in such instances only one memory cell is active at a time while programming.

Figure 3:
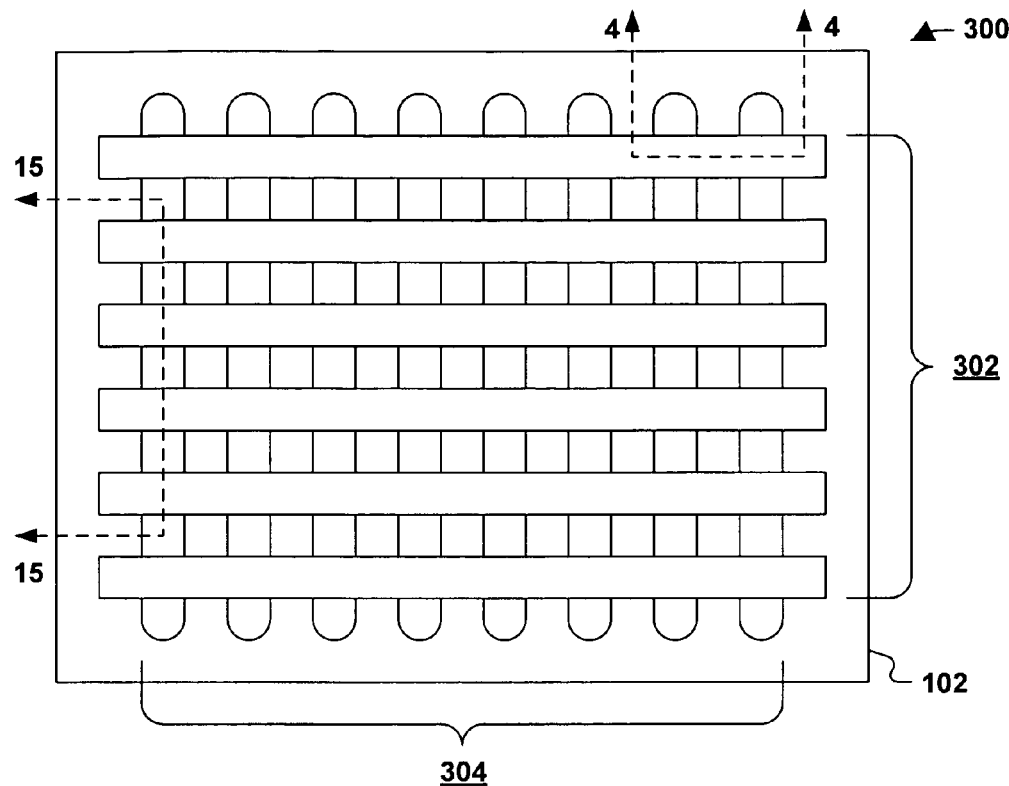
FIG. 3 is a top view of at least a portion of a memory core, such as may include at least part of one of the cores depicted in FIG. 1 in accordance with an aspect of the present invention.

Referring now to FIG. 3, a top view is presented of at least a portion 300 of a memory core, such as may include at least part of one of the M by N array cores 104 depicted in FIG. 1 in accordance with an aspect of the present invention. The memory 300 is formed upon a semiconductor substrate 102 and has a plurality of implanted bitlines 304 extending substantially parallel to one another, and further includes a plurality of formed wordlines 302 extending substantially in parallel to one another and at substantially right angles to the plurality of implanted bitlines 304. It will be appreciated that the wordlines 302 and bitlines 304 have contacts and interconnections (not shown) to programming circuitry such as may be represented, at least in part, by the x-decoders 108 and y-decoders 110 depicted in FIG. 1.

Figure 4:
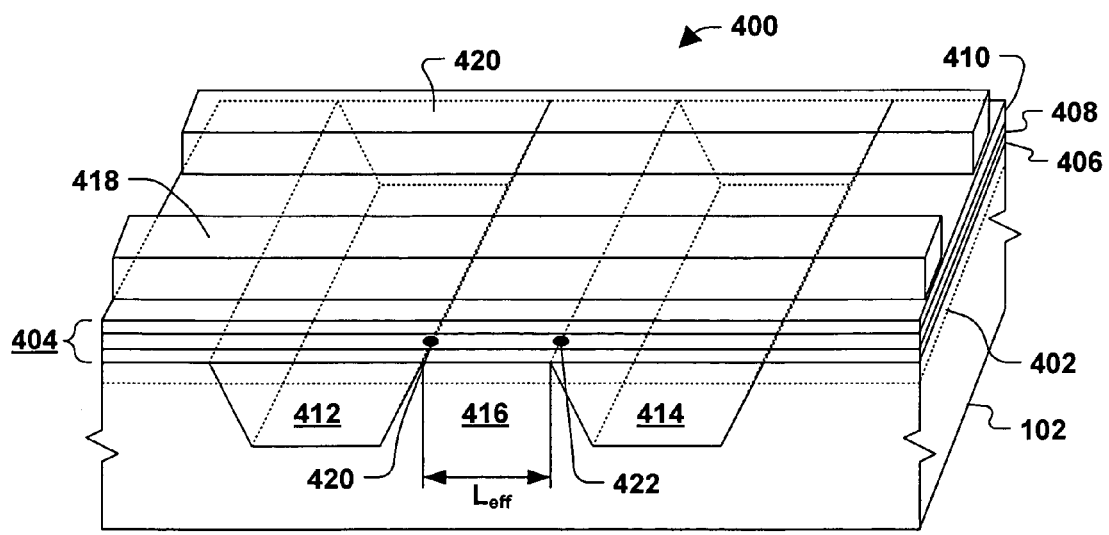
FIG. 4 is a cross-sectional isometric illustration of a portion of a dual bit flash memory, such as that taken along line 4—4 of FIG. 3 in accordance with an aspect of the present invention.

FIG. 4 is a cross-sectional isometric illustration of a portion 400 of a dual bit flash memory, such as that taken along line 4—4 of FIG. 3. A semiconductor substrate 102 upon which the memory is formed is doped with a p-type impurity such as boron, for example, to establish a threshold adjustment implant ($V_{tadjust}$) region 402 therein. The threshold adjustment implant provides a region 402 that is more heavily doped than the semiconductor substrate 102. The substrate can, for example, be formed out of silicon and can itself be doped with a p-type impurity. The threshold adjustment implant 402 assists in controlling a threshold voltage of the various cells within the memory 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are typically formed of an oxide dielectric such as silicon dioxide ($SiO_2$) and the charge-trapping layer 408 is generally formed of a nitride dielectric such as silicon nitride ($Si_xN_y$). The oxide-nitride-oxide configuration is commonly referred to as an ONO layer for convenience. Alternatively, other types of charge-trapping layers may be employed and are contemplated as falling within the scope of the present invention.

First and second conductive bitlines 412 and 414 are depicted in FIG. 4 underlying the charge trapping dielectric layer 404. It will be appreciated that any number of such bitlines can be implanted into the semiconductor substrate 102, and that such bitlines may correspond to the bitlines 304 depicted in FIG. 3. The bitlines are typically formed of an implanted n-type material, such as arsenic, and may include an oxide portion (not shown) in some examples. The first and second conductive bitlines 412 and 414 are spaced apart and define a channel region 416 there-between.

First and second conductive wordlines 418, 420 are similarly depicted overlying the charge-trapping dielectric layer 404. It will be appreciated that any number of such wordlines can be formed over the dielectric layer 404, and that such wordlines may correspond to the wordlines 302 depicted in FIG. 3. The wordlines can be formed out of a polysilicon material, for example, where the polysilicon material may be deposited over the dielectric layer 404 and then patterned and etched.

Locations 420 and 422 indicate generally where respective bits of data can be stored in one or the cells of the memory 400. It will be appreciated that the channel 416 has an effective length $L_{eff}$ and that the bits 420, 422 will be brought closer together as this length is reduced (e.g., as a result of scaling).

Figure 5:
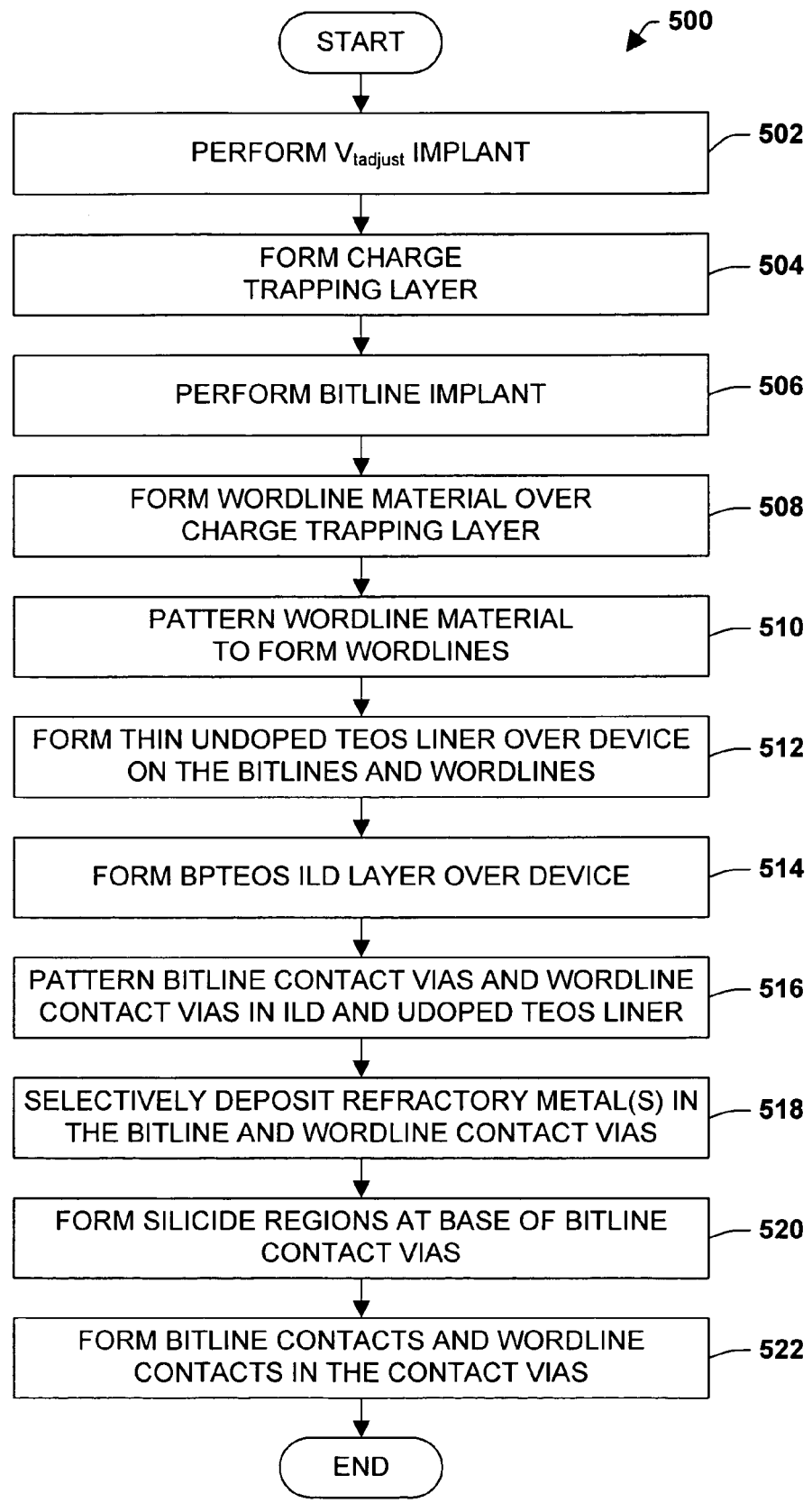
FIG. 5 is a flow diagram illustrating a method for forming a dual bit memory device in accordance with an aspect of the present invention.

Turning to FIG. 5, a flow diagram illustrating a methodology 500 for forming a dual bit memory device according to one or more aspects of the present invention is presented. In particular, the memory device is formed so as to facilitate scaling via bitline width reduction which was heretofore not capable due to limitations associated with resists and/or other patterning materials, techniques or lithography tools. The memory device so formed may, for example, correspond to a portion of a memory core such as may include at least part of one of the M by N array cores depicted in FIG. 1.

Although the methodology 500 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases It will be appreciated that a methodology carried out according to one or more aspects of the present invention may be implemented in association with the formation and/or processing of structures illustrated and described herein as well as in association with other structures not illustrated or described herein.

The memory is formed upon a semiconductor substrate and at 502 a threshold adjustment implant $V_{tadjust}$ is performed to establish a region of the substrate that is more heavily doped than the remainder of the semiconductor substrate. The substrate can, for example, be formed out of silicon and can itself be doped with a p-type impurity such as boron, for example. The threshold adjustment implant may include a greater concentration of and/or a higher energy implant of the same or different p-type dopant utilized in the rest of the substrate, for example, and assists in controlling a threshold voltage of the memory.

At 504 a charge trapping dielectric layer is formed over the semiconductor substrate. This portion of a charge trapping dielectric layer includes a first insulating layer, a charge trapping layer, and a second insulating layer. The charge trapping layer is formed in between the first and second insulating layers, also referred to as lower and upper insulating layers. The first and second insulating layers may be formed of an oxide dielectric such as silicon dioxide ($SiO_2$), for example, and the charge trapping layer may be formed of a nitride dielectric such as silicon nitride ($Si_xN_y$), for example. The first and second insulating layers can be formed to a thickness of about 70 Angstroms or less, for example, while the charge trapping layer can be formed to a thickness between about 60 to 80 Angstroms. It is appreciated that variations in the above thicknesses can be present in accordance with the present invention. Additionally, the upper insulating layer can be comprised of high-k dielectric material.

Other tri-layer dielectric layers can be fabricated as the charge trapping dielectric layer including, but not limited to an ONO tri-layer dielectric (as described above), an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), and the like.

The charge trapping dielectric layer facilitates electron/hole trapping by having a layer with a lower barrier height than the layers sandwiching it (e.g., two layers with relatively higher barrier heights sandwiching a layer with a relatively lower barrier height). In the case of an ONO tri-layer dielectric, for example the insulating oxide layers can have a barrier height of about 3.1 eV, for example, whereas the nitride layer can have a barrier height of about 2.1 eV, for example. In this arrangement, a charge trapping well or region is created in the nitride layer.

A bitline implant is performed at 506. A layer of resist material is typically formed over the charge trapping dielectric layer. One suitable resist is a radiation-sensitive film of material that can be applied to a thickness of between about 2000 to 5000 Angstroms, for example, and fixed onto the charge trapping dielectric layer (e.g., via baking). The resist is then patterned to expose selected portions of the charge trapping dielectric layer. An optional antireflective coating (ARC) (e.g., of an organic material, such as silicon nitride or silicon oxynitride) can also be formed along with the resist to mitigate reflection during exposure and thereby improve the fidelity of pattern transfer. The formed resist is then patterned to expose selected portions of the charge trapping dielectric layer. Subsequently, a suitable dopant is implanted that passes through the charge trapping dielectric layer and into the substrate thereby forming bitlines in the memory. The bitline implant can include one or more n-type dopants (e.g., arsenic, phosphorous and/or antimony) and can be performed at a concentration of between about 0.5E15 and 2E15 atoms/cm$^3$ at an energy level of between about 10 to 70 KeV, for example. It will be appreciated, however, that other suitable implant compositions and concentrations are contemplated as falling within the scope of the present invention. The buried bitlines act as acting sources and acting drains for corresponding memory cells, and respective channels are defined between corresponding pairs of buried bitlines.

A repair operation can optionally be performed in order to correct or mitigate damage that may have occurred to the charge trapping dielectric layer during the bitline implant operation. In alternate aspects of the method, the second insulation layer of the charge trapping dielectric layer is formed after performing the bitline implant, instead of before.

A layer of wordline material is then formed over the charge trapping dielectric layer at 508. The wordline material is a conductive material and can, for example, include polysilicon. The wordline material is patterned at 510 to form wordlines over the buried bitlines. Subsequently, an implant oxide layer can be grown on the wordlines and a wordline salicide region is also formed on an upper surface of the wordlines. The implant oxide layer can mitigate dopant diffusion. The presence of wordline salicide region(s) can reduce contact resistance. Sidewall spacers are also formed on sidewalls of the wordlines.

A thin undoped TEOS liner is formed over the device and over the wordlines and the charge trapping dielectric layer at 512 and an the wordline salicide region(s). The thin undoped TEOS liner is an electrically isolating layer formed using an undoped TEOS gas deposition process, typically a sub atmospheric chemical vapor deposition process (SACVD). The thin undoped TEOS liner is formed to a thickness of about 400 Angstroms or less. The thin undoped TEOS liner mitigates dopant diffusion, generally as a function of its thickness. Additionally, the thin undoped TEOS liner also mitigates charge loss and contact resistance as an inverse function of its thickness. Some examples of suitable process parameters for forming the thin undoped TEOS liner include a pressure at 180 to 240 torr, ozone ($O_3$) at about 3,000 to 5,000 sccm, He is supplied at 5,000 to 7,000 sccm, Teos at 300 to 500 mgm, a temperature of about 450 to 510 degrees Celsius, and a spacing of about 180 to 260 mils. However, it is appreciated that other suitable process parameters can be employed in accordance with the present invention.

Subsequently, an ILD layer is formed over the device at 514. The ILD is formed on the thin undoped TEOS liner by a suitable boron-phosphor doped BPTEOS deposition process, typically a SACVD process. The presence of boron and phosphor facilitate filling in gap areas, such as between gates or gate structures. The ILD layer mitigates or avoids undesired tunneling and shorting. Some examples of suitable process parameters for formation of the ILD include a pressure at 180 to 240 torr, 03 at 3,000 to 5,000 sccm, He at 5,000 to 7,000 sccm, Teos at 300 to 500 mgm, a temperature of about 450 to 510 degrees Celsius, a spacing of about 180 to 260 mils, a first dopant triethylphosphate (TEPO) at about 40 to 70 mgm, and a second dopant triethylborate (TEB) at about 144 to 184 mgm. However, it is appreciated that other suitable process parameters can be employed in accordance with the present invention.

Continuing with the method at 516, bitline contact vias and wordline contact vias are selectively formed in the ILD and through portions of the thin undoped TEOS liner. A small overetched portion of the bitlines and/or wordlines adjacent to the vias may also be removed. Generally, a resist/patterning operation is employed as well as a selective etch chemistry that selectively and readily removes oxide while being somewhat resistant to removing/etching doped and/or undoped silicon and wordline materials. Typically, a cleaning operation is performed after formation of the bitline and wordline contact vias to remove undesired materials from the formation process that may remain. The wordline contact vias are formed to be in contact with the wordline salicide region(s) and the bitline contact vias are formed to be in contact with underlying silicon.

Refractory metals are then selectively deposited in the bitline vias at 518. Examples of suitable refractory metals that can be employed in accordance with the present invention include titanium-nitride or titanium. A barimetal deposition process is typically employed to deposit the refractory metals. Continuing at 520, salicide regions are formed at bases of the bitline contact vias by a salicide reaction between bitline materials and the refractory metal(s) deposited at 518. The formed bitline salicide regions serve to provide a lower contact resistance between subsequently formed contacts and corresponding bitlines.

Bitline and wordline contacts are then formed at 522 by depositing suitable conductive materials into the bitline and wordline contacts vias formed at 516. An example of a suitable material for bitline and/or wordline contacts includes tungsten, copper, and the like.

The method 500 has fabricated the dual bit memory device with a relatively thin undoped TEOS liner or without an undoped TEOS liner. Conventional thinking is that a relatively thick TEOS liner (greater than about 400 Angstroms) is required to adequately protect from unwanted diffusion and to create a properly working dual bit memory device. The inventors of the present invention appreciate that the memory device can function properly with the thin or absent TEOS liner, but that the thin or absent undoped TEOS liner, instead of a conventional thick undoped TEOS liner, facilitates charge retention and lessening of contact resistance. By so doing, the dual bit memory device fabricated by the method 500 is operable to perform at higher speeds, have increased data retention (due to charge retention), and have reduced power consumption as compared to conventional dual bit memory devices that employ a relatively thick undoped TEOS liner layer.

FIGS. 6 to 14B, described below, serve to illustrate an exemplary dual bit memory device formed in accordance with the present invention according to the method 500 of FIG. 5. The FIGS. 6 to 14B illustrate exemplary structures and thickness so as to further illustrate the present invention and the method 500 of FIG. 5. However, it is appreciated that substantial variations in the illustrated structures and variations from the illustrated structure can be present in and be in accord with the present invention.

Figure 6:
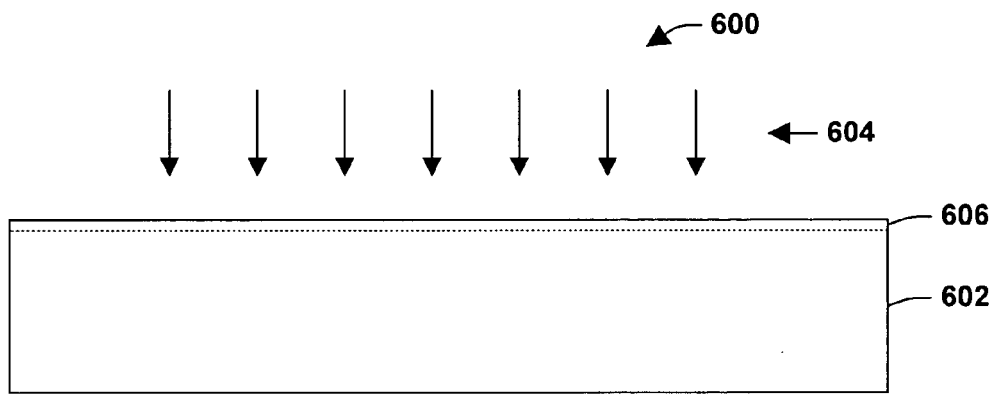
FIG. 6 is a cross sectional view of a dual bit memory device after a threshold adjustment implant in accordance with an aspect of the present invention.

Beginning at FIG. 6, a cross sectional view of a dual bit memory device 600 after a threshold adjustment implant in accordance with an aspect of the present invention is provided. A threshold adjustment implant 604 is performed to establish a region 606 of a substrate 602 that is more heavily doped than a remainder of the substrate 602. The substrate 602, itself, can be undoped or doped with a p-type dopant such as boron. The threshold adjustment implant, performed at 502 of FIG. 5, includes implanting a suitable dopant (e.g., boron) such that the heavily doped region 606 has a greater dopant concentration than remaining portions of the substrate 602.

Figure 7:
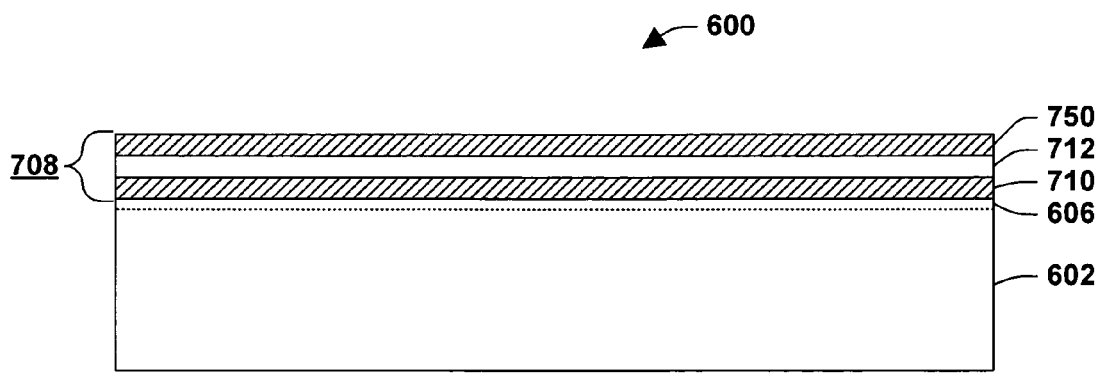
FIG. 7 is a cross sectional view of the dual bit memory device after formation of a charge trapping dielectric layer in accordance with an aspect of the present invention.

FIG. 7 is a cross sectional view of the dual bit memory device 600 after formation of a charge trapping dielectric layer in accordance with an aspect of the present invention. A charge trapping dielectric layer 708 is shown formed on the heavily doped region 606 of the substrate 602. The charge trapping dielectric layer 708 includes a first or lower insulating layer 710, a charge trapping layer 712, and a second or upper insulating layer 750.

The first and second insulating layers 710 and 750 may be formed of an oxide dielectric such as silicon dioxide ($SiO_2$). The charge trapping layer 712 is comprised of a suitable material such as silicon nitride. The charge trapping dielectric layer 708 can be comprised of other materials and layers including, but not limited to an ONO tri-layer dielectric (as described above), an oxide/nitride bilayer dielectric, a nitride/oxide bilayer dielectric, an oxide/tantalum oxide bilayer dielectric ($SiO_2/Ta_2O_5$), an oxide/tantalum oxide/ oxide trilayer dielectric ($SiO_2/Ta_2O_5/SiO_2$), an oxide/strontium titanate bilayer dielectric ($SiO_2/SrTiO_3$), an oxide/ barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/ barium strontium titanate trilayer dielectric ($SiO_2/SrTiO_3/BaSrTiO_2$), and the like. It is also contemplated that the second insulatiomg layer 750 can be comprised of a high-k dielectric material.

The charge trapping dielectric layer 708 facilitates electron/hole trapping by having a layer with a lower barrier height 712 than the layers sandwiching it (e.g., two layers with relatively higher barrier heights sandwiching a layer with a relatively lower barrier height 710 and 750). In the case of an ONO tri-layer dielectric, for example the insulating oxide layers can have a barrier height of about 3.1 eV, for example, whereas the nitride layer can have a barrier height of about 2.1 eV, for example. In this arrangement, a charge trapping well or region is created in the nitride layer.

Figure 8:
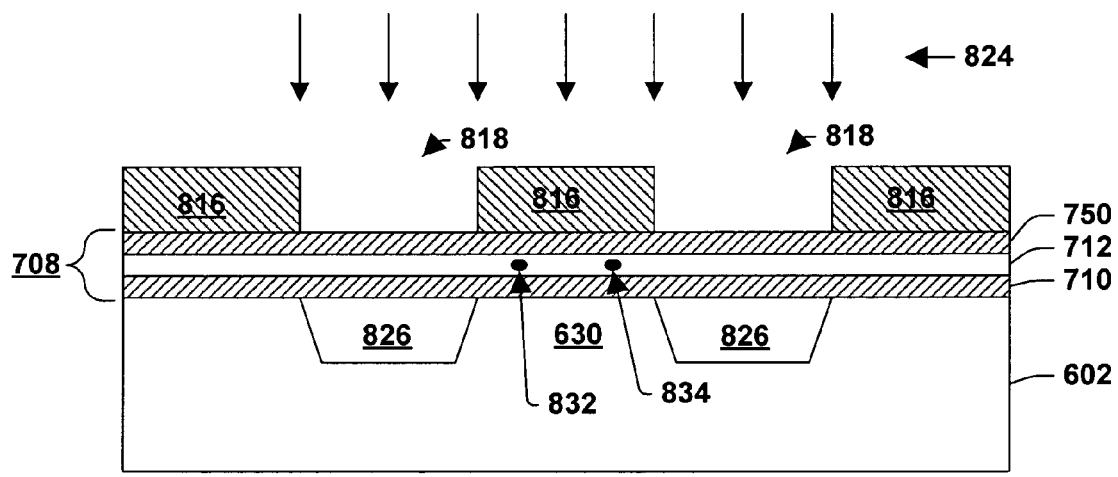
FIG. 8 is a cross sectional view of the dual bit memory device during bitline formation in accordance with an aspect of the present invention.

FIG. 8 is a cross sectional view of the dual bit memory device 600 during bitline formation in accordance with an aspect of the present invention. A deposited and patterned layer of resist 816 is shown formed on the charge trapping dielectric layer 708. openings 818 within the layer of resist 816 allow dopant(s) to implant through the charge trapping dielectric layer 708 and into the substrate 602 thereby forming bitlines 826. Typically, an ion implantation procedure with an n-type dopant, such as phosphor, is employed to form the bitlines 826. By so doing, first and second charge trapping regions 832 and 834 are formed for each cell within the charge trapping dielectric layer 708 to store at least a bit of information, respectively. Additionally, a channel region 630 is defined between consecutive bitlines.

Figure 9A:
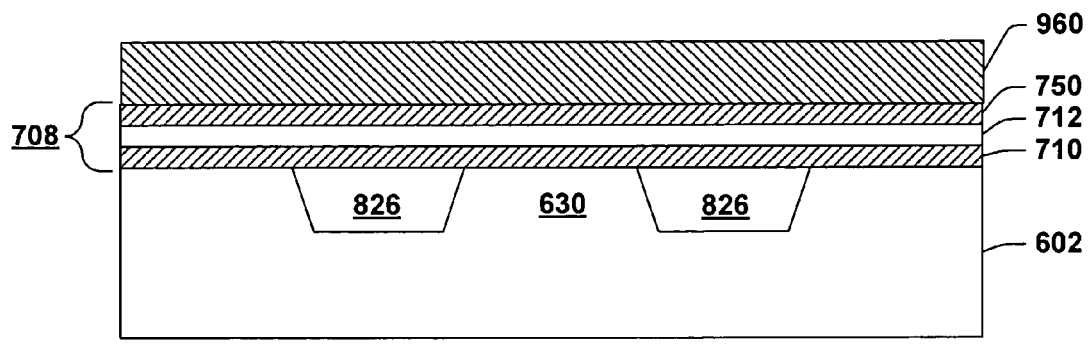
FIGS. 9A and 9B are cross sectional views of the dual bit memory device after formation of wordlines in accordance with an aspect of the present invention.
Figure 9B:
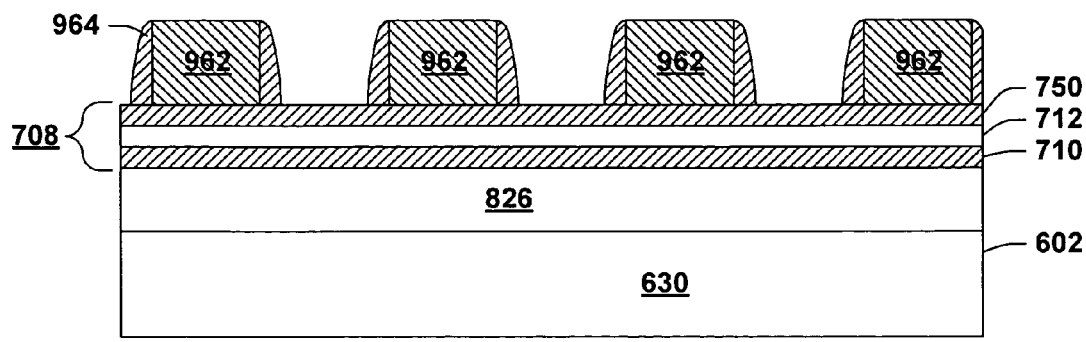

FIG. 9A is a cross sectional view of the dual bit memory device 600 after formation of wordlines in accordance with an aspect of the present invention. A layer of conductive material is formed over the charge trapping dielectric layer 705. The layer is then patterned to form wordlines 960. which are formed orthogonal to the bitlines 26. Additionally, an implant oxidation layer (not shown) can be grown around the wordlines 960 in order to mitigate diffusion. FIG. 9B is another cross sectional view of the dual bit memory device 600 also after formation of wordlines in accordance with an aspect of the present invention. FIG. 9B is orthogonal to FIG. 9A and depicts wordlines 962 and a singline bitline of the bitlines 826. FIG. 9B illustrates formation of sidewall spacers 964 on sidewalls of the wordlines 962. The sidewall spacers 964 comprise an insulative material, such as oxide, and are formed by a suitable growth or deposition process. The sidewall spacers 964 can be formed as a composite of a number of layers.

Figure 10A:
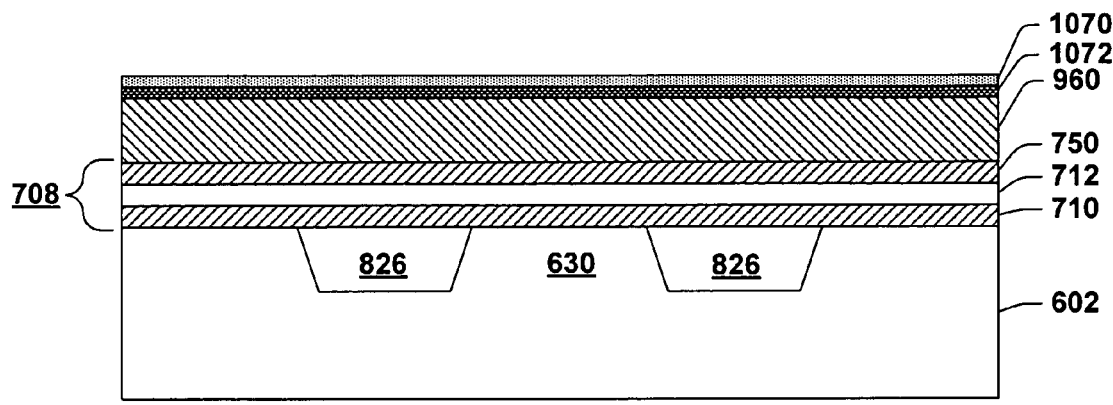
FIGS. 10A and 10B are cross sectional views of the dual bit memory device after formation of a relatively thin undoped TEOS liner in accordance with an aspect of the present invention.
Figure 10B:
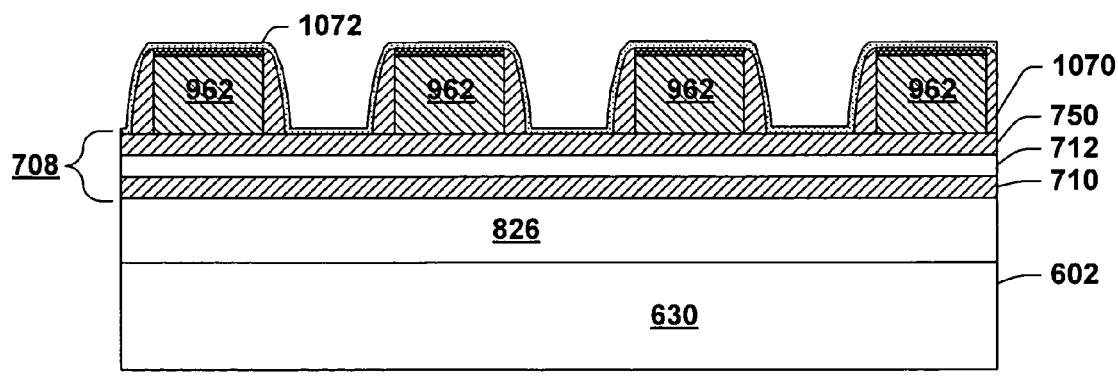

FIGS. 10A and 10B are cross sectional views of the dual bit memory device 600 after formation of a relatively thin undoped TEOS liner 1070 in accordance with an aspect of the present invention. FIG. 10B is orthogonal to FIG. 10A. FIG. 10A depicts the undoped TEOS liner 1070 formed over the wordline 960. FIG. 10B illustrates the undoped TEOS liner 1070 formed on the wordlines 962 (tops and sides) as well as on portions of the charge trapping dielectric layer 708. The thin undoped TEOS liner 1070 is an electrically isolating layer formed using an undoped TEOS gas deposition process, typically a low pressure chemical vapor deposition process (LPCVD). The thin undoped TEOS liner 1070 is formed to a thickness of about 400 Angstroms or less. The thin undoped TEOS liner 1070 mitigates dopant diffusion, generally as a function of its thickness. Additionally, the thin undoped TEOS liner 1070 also mitigates charge loss and contact resistance as an inverse function of its thickness.

Prior to forming the undoped TEOS liner 1070, salicide regions 1072 are formed on the wordlines. A barametal deposition process employing a suitable material such as cobalt can be employed. The salicide regions 1072 can be formed concurrently with salicide formation on poly gates within a periphery region of the memory device in order to reduce processing steps. A barametal deposition of a suitable material (e.g., cobalt) is then reacted to form the salicide regions 1070 (e.g., comprised of cobalt-silicide).

Figure 11A:
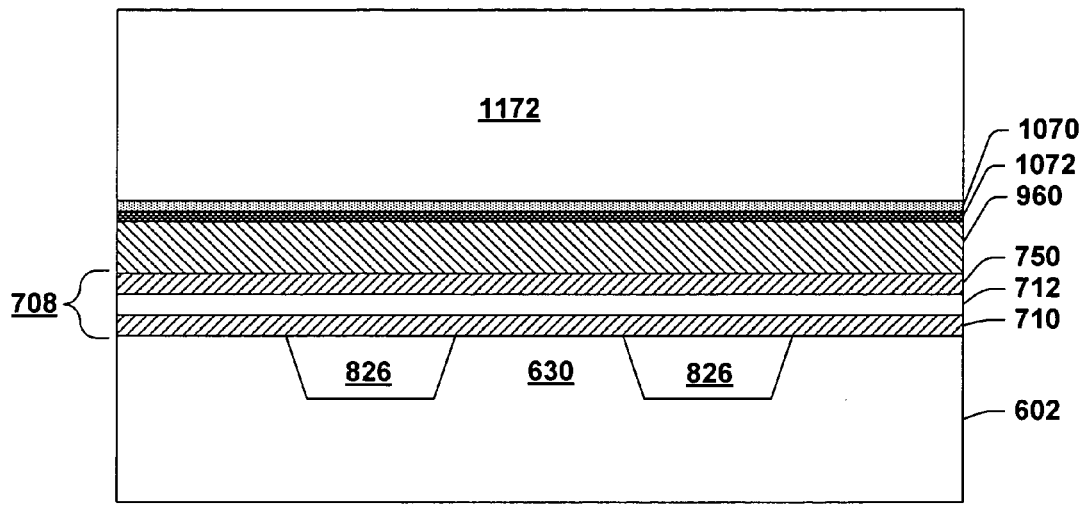
FIGS. 11A and 11B are cross sectional views of the dual bit memory device after formation of an ILD layer in accordance with an aspect of the present invention.
Figure 11B:
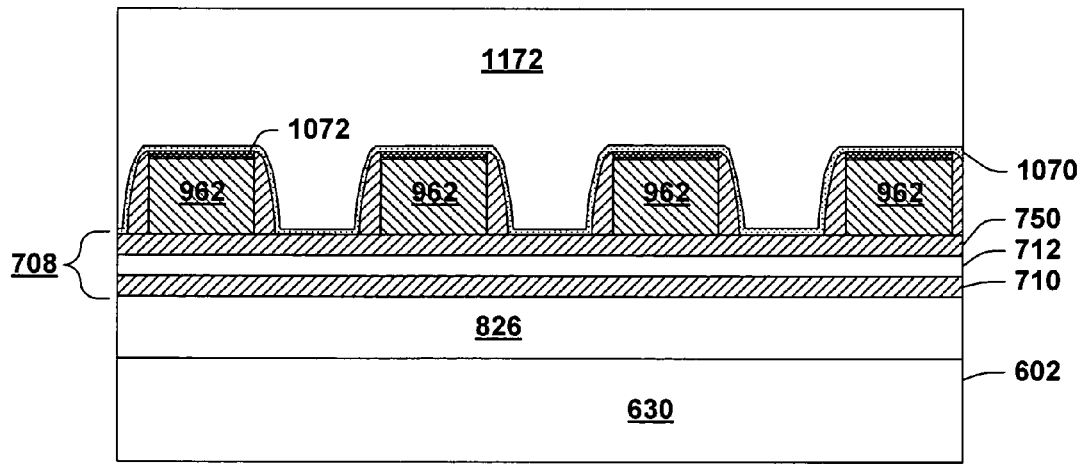

FIGS. 11A and 11B are cross sectional views of the dual bit memory device 600 after formation of an ILD layer 1172 in accordance with an aspect of the present invention. FIG. 11A shows the ILD layer 1172 formed on the thin undoped TEOS liner 1070. FIG. 11B is orthogonal to FIG. 11A and depicts the ILD layer 1172 filling in regions between wordlines. The ILD layer 1172 is formed on the thin undoped TEOS liner 1070 by a suitable boron-phosphor doped BPTEOS deposition process, typically a LPCVD process. The presence of boron and phosphor facilitate filling in gap areas, such as between gates or gate structures. The ILD layer 1172 mitigates or avoids undesired tunneling and shorting.

Figure 12A:
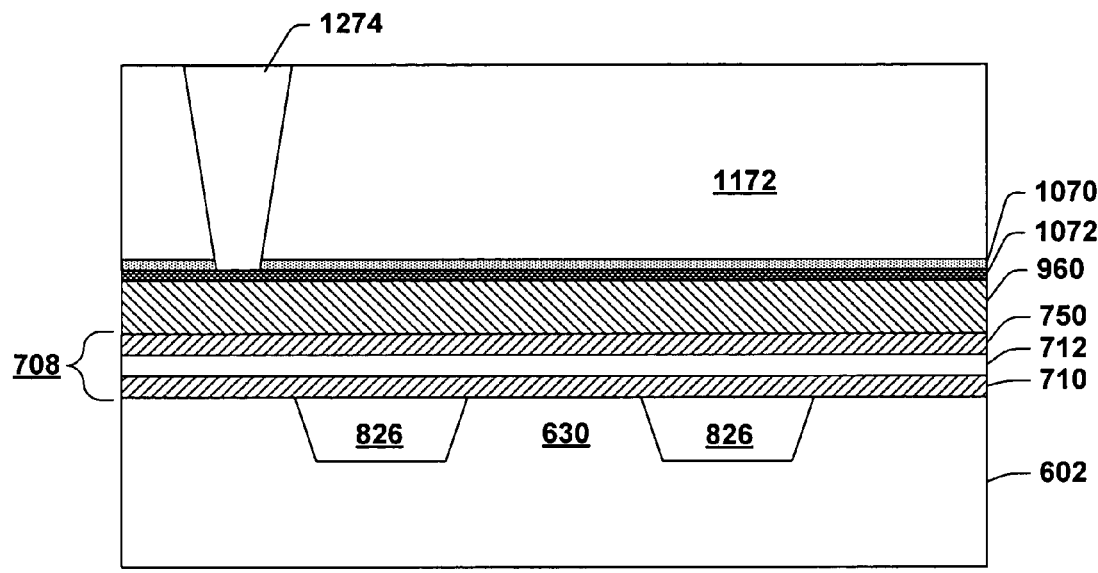
FIGS. 12A and 12B are cross sectional views of the dual bit memory device after formation of wordline and bitline contact vias in accordance with an aspect of the present invention.
Figure 12B:
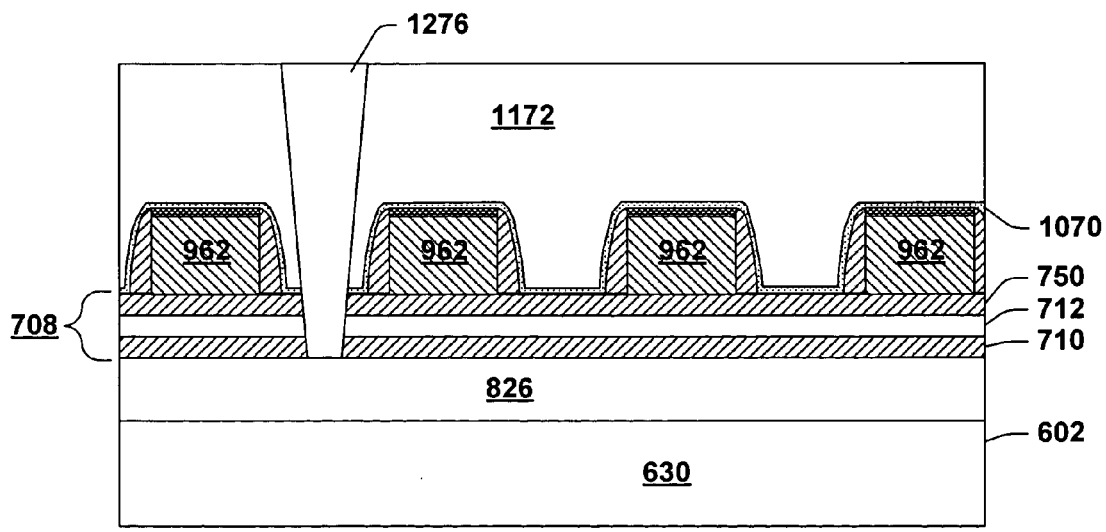

FIGS. 12A and 12B are cross sectional views of the dual bit memory device 600 after formation of wordline and bitline contact vias in accordance with an aspect of the present invention. FIG. 12A illustrates a wordline contact via 1274 formed in the ILD layer 1172, through the thin undoped TEOS liner 1070 and in contact with the wordline salicide layer 1072. FIG. 12B is orthogonal to FIG. 12A and depicts a bitline contact 1276 formed in the ILD layer 1172, through the thin undoped TEOS liner 1070, through the charge trapping dielectric layer 708, and in contact with one of the bitlines 826. Generally, a resist/patterning operation is employed as well as a selective etch chemistry that selectively and readily removes insulative material while being somewhat resistant to removing/etching doped and/or undoped silicon and wordline materials. Typically, a cleaning operation is performed after formation of the bitline and wordline contact vias to remove undesired materials from the formation process that may remain.

Figure 13A:
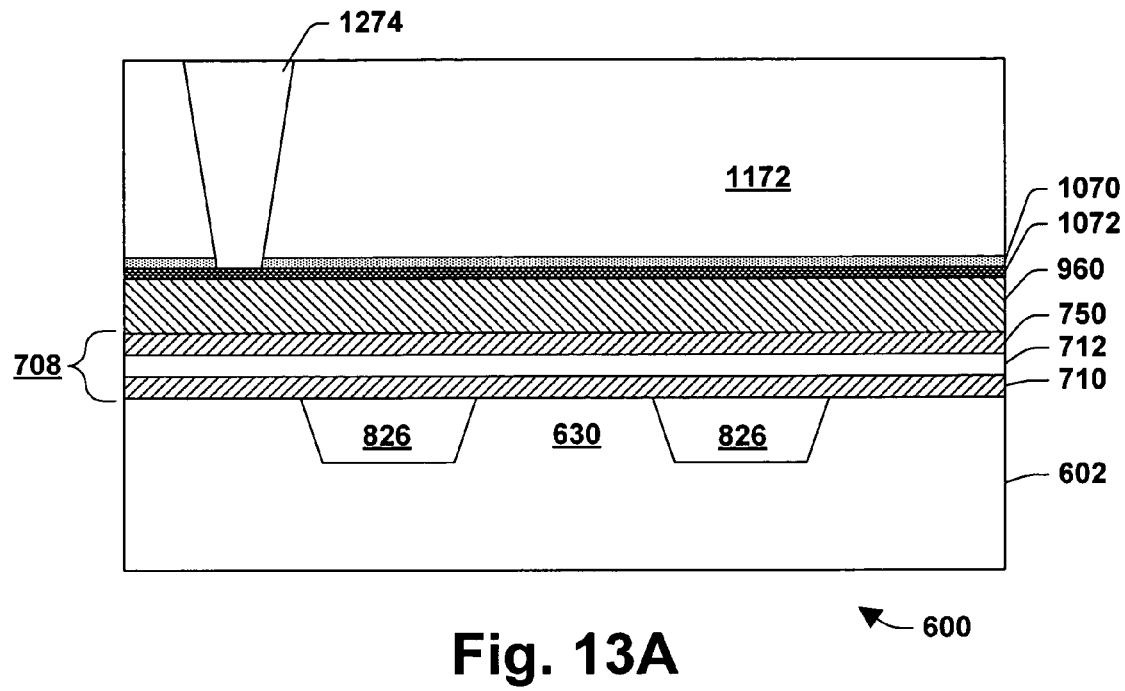
FIGS. 13A and 13B are cross sectional views of the dual bit memory device after formation of bitline salicide regions in accordance with an aspect of the present invention.
Figure 13B:
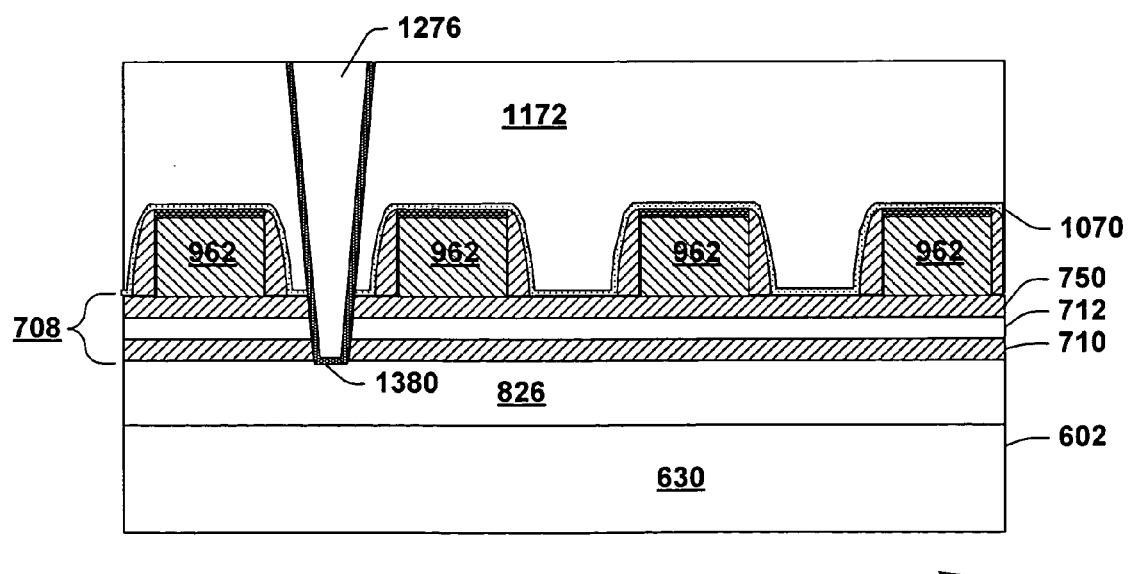

FIGS. 13A and 13B are cross sectional views of the dual bit memory device 600 after formation of wordline and bitline salicide regions in accordance with an aspect of the present invention. Salicide regions are already present for the wordline contacts 174. As a result, FIG. 13A again illustrates the wordline contacts in contact with the wordline salicide region 1072. FIG. 13B is orthogonal to FIG. 13A and depicts a salicide region 1380 formed in the bitline contact via 1276. The salicide regions 1380 is formed by depositing a refractory metal (e.g., peforming a barametal dposition) in the bitline contact vias followed by a salicide operation that causes the deposited refractory metal to interact with underlying material from the bitlines/wordlines. The refractory metal, such as TiN or Ti, covers lower and upper surfaces of the bitline contact vias 1276. However, the salicde region 1380 is substantially formed at a bottom of the contact vias 1276 (e.g., as Ti-silicide). The presence of the salicide regions 1380 provides for a lower contact resistance.

FIGS. 14A and 14B are cross sectional views of the dual bit memory device 600 after formation of wordline contacts and bitline contacts in accordance with an aspect of the present invention. FIG. 14A illustrates a wordline contact 1482 formed within the wordline contact via 1274. FIG. 14B is orthogonal to FIG. 14A and depicts a bitline contact 1484 formed in the bitline contact via 1276. The wordline contact 1482 and bitline contact 1484 are comprised of a suitable conductive material for bitline and/or wordline contacts including tungsten, copper, and the like.

It will be further appreciated that any of the layers described herein can be formed in any one or more suitable manners, either alone or in combination, such as with spin-coating techniques, spray-on techniques, sputtering techniques (e.g., magnetron or ion beam sputtering), growth and/or deposition techniques, such as chemical vapor deposition (CVD) and/or low pressure chemical vapor deposition (LPCVD), for example.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of fabricating a dual bit memory device comprising:
    forming a charge trapping dielectric layer on a semiconductor substrate;
    depositing a resist layer on the charge trapping dielectric layer;
    patterning the resist layer to selectively leave openings in the resist layer;
    performing a bitline implant through the openings in the resist layer to form bitlines that operate as acting sources and acting drains;
    removing the resist layer;
    forming a wordline layer on the charge trapping dielectric layer;
    patterning the wordline layer to form wordlines that overlie the bitlines;
    forming a relatively thin undoped TEOS liner on the wordlines and the charge trapping dielectric layer;
    forming a BPTEOS interlayer dielectric layer on the relatively thin TEOS layer;
    forming wordline and bitline contact vias in the BPTEOS interlayer dielectric layer by selectively etching through the BPTEOS interlayer dielectric layer, and the relatively thin TEOS layer;
    forming bitline contacts in the bitline vias that contact bitlines and wordline contacts in the wordline vias that contact wordlines.

2. The method of claim 1, further comprising:
    depositing a refractory metal in the wordline and bitline contact vias prior to forming the bitline and wordline contacts;
    saliciding the deposited refractory metal in the wordline contact vias to interact with an upper surface of the wordlines to form wordline salicide regions; and
    saliciding the deposited refractory metal in the bitline contact vias to interact with an upper surface of the bitlines to form bitline salicide regions.

3. The method of claim 1, wherein the relatively thin undoped TEOS liner is formed by a low pressure chemical vapor deposition process with TEOS at 700 degrees Celsius.

4. The method of claim 1, wherein the relatively thin undoped TEOS liner is formed to a thickness of less than 400 Angstroms.

5. The method of claim 1, wherein the relatively thin undoped TEOS liner is formed to a thickness of less than 200 Angstroms.

6. The method of claim 1, wherein the relatively thin undoped TEOS liner is formed to a thickness that sufficiently mitigates unwanted dopant diffusion and reduces contact resistance and charge loss.

7. The method of claim 1, wherein the charge trapping dielectric layer is formed by:
    forming a first insulating layer on the semiconductor substrate;
    forming a charge trapping layer on the first insulating layer; and
    forming a second insulating layer on the charge trapping layer.

8. The method of claim 7, further comprising repairing the second insulating layer after performing the bitline implant.

9. A method of fabricating a dual bit memory device comprising:
- selecting a thickness for a relatively thin undoped TEOS liner according to desired charge loss, desired contact resistance, and device operation;
- forming a charge trapping dielectric layer on a semiconductor substrate;
- performing a bitline implant to form bitlines in the semiconductor substrate, wherein the bitlines operate as acting sources and acting drains for dual bit operation;
- depositing a conductive material over the charge trapping dielectric layer;
- patterning the deposited conductive material to form wordlines; and
- forming the undoped TEOS liner with the selected thickness on the wordlines and the charge trapping dielectric layer.

10. The method of claim 9, wherein the selected thickness is less than about 400 Angstroms.

11. The method of claim 9, wherein the selected thickness is about 0 Angstroms.

12. The method of claim 9, further comprising forming an interlayer dielectric layer over the device and on the undoped TEOS liner that mitigates shorting between the wordlines and the bitlines.

13. The method of claim 12, further comprising forming wordline contacts in the interlayer dielectric layer, through a portion of the undoped TEOS liner, and in contact with associated wordlines.

14. The method of claim 12, further comprising forming bitline contacts in the interlayer dielectric layer, through a portion of the undoped TEOS liner, and in contact with associated bitlines.

* * * * *